(12) United States Patent
Yoshizawa

(10) Patent No.: US 6,369,644 B1
(45) Date of Patent: Apr. 9, 2002

(54) FILTER CIRCUIT

(75) Inventor: Atsushi Yoshizawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/219,840

(22) Filed: Dec. 23, 1998

(30) Foreign Application Priority Data

Dec. 24, 1997 (JP) .......................................... P09-354938

(51) Int. Cl.7 ................................................. H03K 5/00
(52) U.S. Cl. ...................... 327/553; 327/552; 327/332; 327/306; 330/282
(58) Field of Search ................................ 327/552, 557, 327/556, 331, 332, 308, 560; 330/105, 107, 305, 282

(56) References Cited

U.S. PATENT DOCUMENTS

| | | | |
|---|---|---|---|
| 4,524,380 A | * | 6/1985 | Shibata et al. ............... 358/316 |
| 4,910,799 A | | 3/1990 | Takayama ................... 455/296 |
| 5,124,850 A | * | 6/1992 | Kizu .......................... 360/33.1 |
| 5,287,555 A | | 2/1994 | Wilson et al. .............. 455/115 |
| 5,510,853 A | * | 4/1996 | Kawano ...................... 348/678 |
| 5,940,143 A | | 8/1999 | Igarashi et al. ............. 348/678 |

OTHER PUBLICATIONS

A. A. S. Sluyterman, *The Camel CRT*, SID International Symposium Digest of Technical Papers, US, Santa Ana, CA, vol. 29, pp. 351–354, May 17, 1998.

* cited by examiner

*Primary Examiner*—Dinh T. Le
(74) *Attorney, Agent, or Firm*—Jay H. Maioli

(57) ABSTRACT

A filter circuit extracts a desired signal in the presence of interference by using a variable gain circuit whose input is the frequency converted received signal and whose output is fed through an active filter to produce the desired signal. The signal levels before and after the active filter are detected and the higher level is used to control the gain of the variable gain circuit.

6 Claims, 7 Drawing Sheets

FILTER CIRCUIT

BACKGROUND OF THE INVENTION

1. Field of the Invention

The present invention relates to a filter circuit suitable for extraction of a signal of the desired frequency band and particularly to a filter circuit which is useful for selection of a particular channel signal in a mobile radio system.

2. Description of the Related Art

In a hand-held transceiver, for example, a mobile radio or a portable type telephone set, etc. which is operated as a terminal of mobile communication system, an audio data is modulated by many sub-carriers frequency-divided for the high frequency (GHz) carrier frequency assigned to such radio system and moreover modulated to the channel of a particular frequency band in which each sub-carrier frequency is divided into the time slots of several tens of channels for the purpose of transmission and reception thereof.

In such a mobile radio system, an input receiving signal level received by a terminal changes to a large extent depending on the operating environment and it must be assumed that such input receiving signal level changes as much as 80 dB or more, for example, depending on distance between the terminal and base station and level changes caused by fading.

Moreover, it can also be thought that such a bad environment that the signal level of the target channel is low and there is an intensive interference wave for the adjacent channels exists.

Therefore, a high frequency circuit of the double-super receiving system is generally employed in the transmitting and receiving system of such mobile radio but as a filter circuit to accurately extract the target frequency, a filter using a bulk element (saw filter, piezoelectric element, etc.) is mainly used to cover the high sharpness and wide dynamic range.

However, since the hand-held terminal is required to be small in size and light weight, it is considered, for example, to use an active filter formed of an IC circuit as a filter circuit provided between intermediate frequency stages, etc.

FIG. 1 shows an example of the receiving high frequency circuit of a terminal.

The radio wave transmitted from the base station is received by an antenna 100, it is then amplified by a high frequency amplifier 101 consisting of a low noise GaAs FET element, etc., for example, and this signal is converted to a first intermediate frequency through the mixing with a signal of a first local oscillator 103 being supplied to a first mixer 102. The predetermined frequency band of this converted first intermediate frequency is extracted by a saw filter 104 and it is supplied to a second mixer 106 after it is amplified by an intermediate amplifier 105.

A signal is also supplied to the second mixer circuit 106 from a second local oscillator 107 for selection of the desired channel and thereby the signal of the frequency band of the target channel can be obtained as the second intermediate frequency.

Therefore, an active filter circuit 109 is provided to select the signal of the second intermediate frequency band. However, since the active filter circuit 109 for selecting the channel of the target frequency band has a lower dynamic range, it is required, as explained above, to provide a gain varying amplifier 108 in the preceding stage of this active filter circuit 109 and the gain of the gain varying amplifier 108 is controlled by the signal fed back from the level detecting circuit 110 for detecting output signal level of the active filter.

The signal of the target frequency band extracted by the active filter circuit 109 is waveform-shaped to have a constant amplitude by a multi-stage connected limiter circuit 111 and is then input to a signal processing circuit 120 for extracting data.

However, for example, an active filter circuit 109 consisting of an inductance element, etc. formed by combining a resistance element and a capacitance element or active element (transistor, amplifier) is effective for reduction in size and weight of the hand-held terminal and also for reduction in power but in the IC circuit, a gm-C circuit utilizing transconductance of a pair of differential transistors is often used to realize a filter having the high precision frequency characteristic. Therefore, such filter circuit is generally limited to operate in the stable filter characteristic only for the range in which the amplifying element operates linearly.

In addition, when the active filter is designed to have higher sharpness and to assure lower power consumption by the low voltage drive, the following problems are generated.

The first problem is a dynamic range of the feedback loop by the feedback control.

Since the active filter circuit 109 has the frequency characteristic allowing the predetermined frequency to pass by forming inside the complicated feedback loop, this filter can generally be considered as a linear element and therefore the feedback control itself generates a problem when this circuit is provided within the loop of the feedback circuit.

For example, when non-linear behavior of the active filter circuit 109 does not increase monotonously, polarity of the feedback signal is inverted and normal feedback operation is not properly maintained.

In this case, here rise the problems, for example, that intensive signal is momentarily input and after the filter circuit 109 is deeply saturated, the intrinsic level control operation does not start.

Next, the second problem is effective use of dynamic range for the receiving signal.

As shown in FIG. 1, when the gain control is conducted with a signal used to detect an output signal level of the active filter circuit 109 by arranging the gain varying amplifier 108 to the preceding stage of the active filter circuit 109, here rise the problems that the control level La of the desired wave of the frequency band passing through the active filter circuit 109 is different from the control level Lb of the interference wave of the frequency band attenuated by the filter circuit as shown in FIG. 2 and this level differences is uniquely determined by the attenuation characteristic of the active filter circuit 109.

In general, due to characteristic difference of each node voltage forming the active filter circuit 109, the upper limit of receiving range a of the desired wave by saturation of the desired wave itself in the passing frequency band must be set to the level different from that of the upper limit of the mixing range b of the interference wave restricted by masking the desired wave with the saturated interference wave within the rejection band. Moreover, in order to effectively use the dynamic range of the filter, the control level La of the desired wave is preferably set to the upper limit of the receiving range a of the desired wave, while the control level Lb of the interference wave is preferably set based on the upper limit of the mixing range b of the interference wave.

However, if a level difference between the control level La of the desired wave and the control level Lb of the interference wave is uniquely determined only by the attenuation characteristic of the active filter circuit 109, here rises a problem that if it is attempted to control only one level desired most effectively, the other level is not always controlled to the optimum level and the control level for effectively utilizing the operation range of the filter cannot be set.

SUMMARY OF THE INVENTION

In order to solve the problems explained above, the filter circuit of the present invention is provided with:

filter means having different gain characteristics for the first frequency band and second frequency band;

gain control means for controlling an input signal including the signals of at least first and second frequency bands and supplying the level-controlled output signal to the filter means;

first level detecting means for detecting the level of output signal of the filter means;

second level detecting means for detecting the input level of the filter means; and switching means for outputting the detecting signal of higher level of the detecting signals of the first or second level detecting means.

The gain of the gain control means is controlled by the signal output from this switching means.

The filter means may be structured by the controllably connected first and second filter circuits. In this case, control is conducted by detecting an output level of the first filter circuit with the first level detecting means.

Moreover, it is also possible to conduct gain control of the desired wave by supplying an output of the gain control means to the first filter circuit having the desired frequency characteristic and the second filter circuit having the characteristic similar to that of the first filter circuit and then detecting an output signal of the second filter circuit with the first detecting means.

Since the filter circuit of the present invention is designed, as explained above, to control the level of the signal including interference wave to the predetermined value with the second level detecting means to detect the signal to be input to the active filter circuit and to set the control level for the desired wave with the first level detecting means to detect the signal level of the desired wave output from the active filter circuit, the stable level control can be realized even when the filter circuit has the non-linear characteristic and the dynamic range can be used effectively.

DESCRIPTION OF THE PREFERRED EMBODIMENTS

A preferred embodiment of the filter circuit of the present invention will be explained with reference to FIG. 3.

Figure 1:
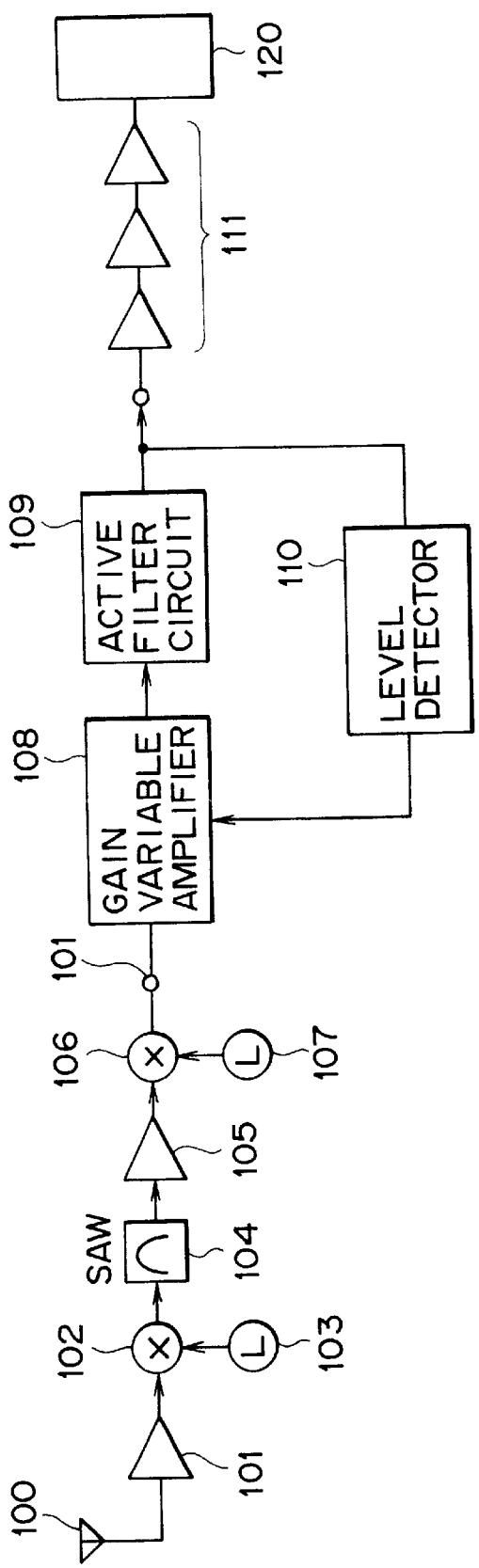
FIG. 1 is a block diagram showing an example for use of active filter by setting an adequate dynamic range.

In this FIG., the antenna, high frequency amplifier, and first and second frequency converters are designated by the reference numerals like those in FIG. 1.

A signal of the desired frequency band extracted by the filter circuit and a signal of the frequency band of interference wave are input to the gain variable circuit 11 from the terminal 10, supplied to the active filter circuit 12 structured by active element and the output signal from the terminal 13 of the active filter circuit 12 is waveform-shaped by the limiter circuit and is then supplied to the demodulating circuit for signal data.

14a designates a first coefficient circuit for multiplying the predetermined coefficient to the output signal level of the active filter circuit 12; 14b designates a second coefficient circuit for multiplying the predetermined coefficient to the input signal level of the active filter circuit 12; 15a, 15b designate respectively a first and a second level detecting circuit for detecting output levels of the first and second coefficient circuits 14a, 14b.

Moreover, 16 designates a switch circuit for relatively detecting and outputting the signal of the higher level of the detected signals of the first and second level detecting circuits 15a and 15b. For example, this switch circuit may be structured by an analog circuit which preferentially outputs the higher level signal utilizing, for example, the differential circuit.

An output of the switch circuit 16 is input to a comparator (differential amplifier) 17 for comparison with an output of the reference signal source 18. An output controls the gain of the gain variable circuit 11 via a clip circuit 19.

Figure 4A:
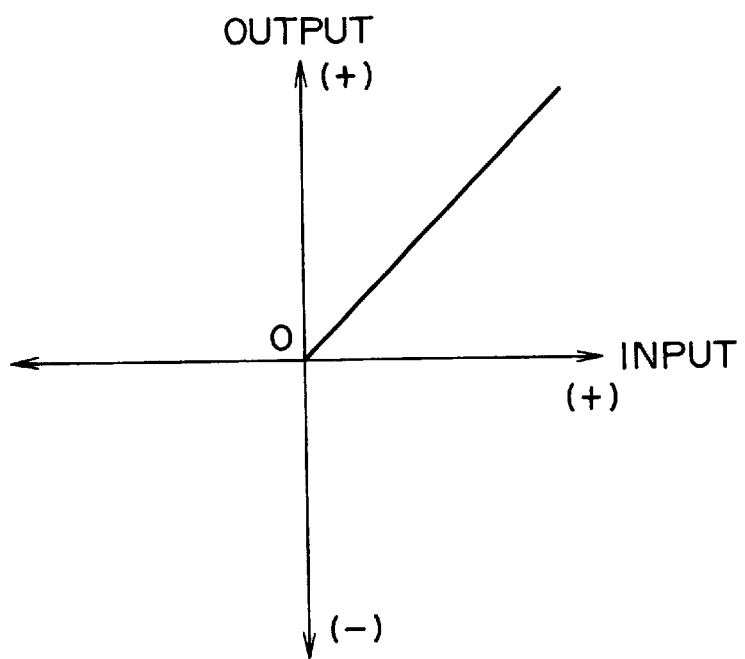
FIG. 4A and FIG. 4B are diagrams for explaining the characteristic of the clip circuit and signal level of each input frequency band.

The clip circuit 19 used has the input/output characteristic, for example, as shown in FIG. 4A and can adjust degree of gain control by adjusting the output characteristic.

Figure 4B:
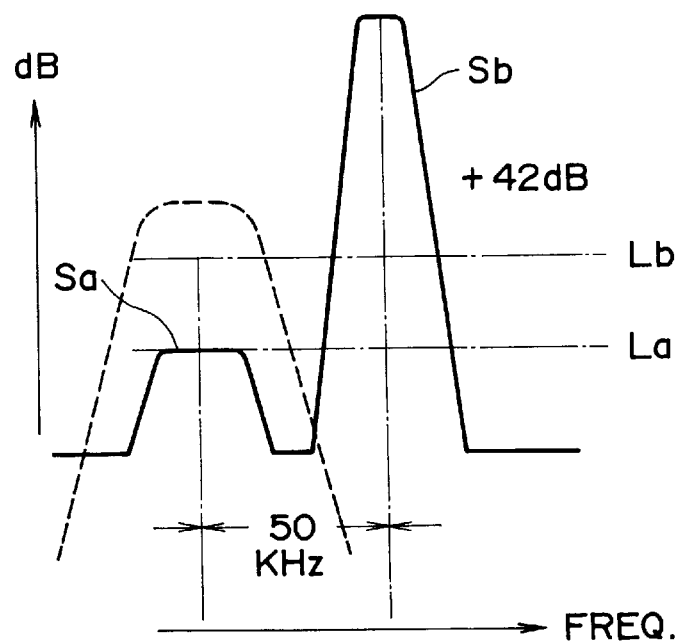

Since the present invention has a structure explained above, when an interference signal element Sb in the level higher than the signal element Sa of the desired signal in the selected channel exists in the adjacent channels of the input signal, for example, as shown in FIG. 4B, the level of the interference signal having passed the gain variable circuit 11 is adequately converted by the coefficient circuit 14b and it is then detected by the second level detecting circuit 15b.

In the switch circuit 16, the signal from a level detector 15b is selected and output to control the gain of a gain variable circuit 11 via the comparator 17 and clip circuit 19. As a result, the gain control is conducted first so that the input signal level including the interference wave is output under the controlled condition.

Namely, the interference wave of the frequency band to be rejected by the active filter circuit 12 is level-controlled by the gain variable circuit 11 so that the active filter circuit 12 is never saturated.

As explained above, when the level of desired frequency signal being input simultaneously is lower than the interference wave level, the detected signal of the interference wave element Sb output from the second level detecting circuit 15b controls first the gain to suppress the input level of interference wave element Sb. After the level of the interference wave is suppressed, the level of the desired wave signal element Sa with less attenuation amount through the pass-band area from the output side of the active filter circuit 12 is superior to the level of the interference wave and thereby an output of the first level detecting circuit 15a controls the gain of the gain variable circuit 11.

As explained, the filter circuit of the present invention is provided with the function to suppress the interference wave in the input side of the active filter circuit 12 even when an intensive interference wave of several tens of kHz, for example, exists in the adjacent channels together with the desired wave. Therefore, even when a signal having a wide dynamic range which does not monotonously increase the gain characteristic of the active filter circuit 12 is input, the feedback circuit no longer becomes unstable and the active filter circuit 12 can be prevented to enter the lock condition which disables to realize its functions and to become unstable because it is saturated, even under the bad condition that the intensive interference wave is input simultaneously during the reception of signal.

Figure 2:
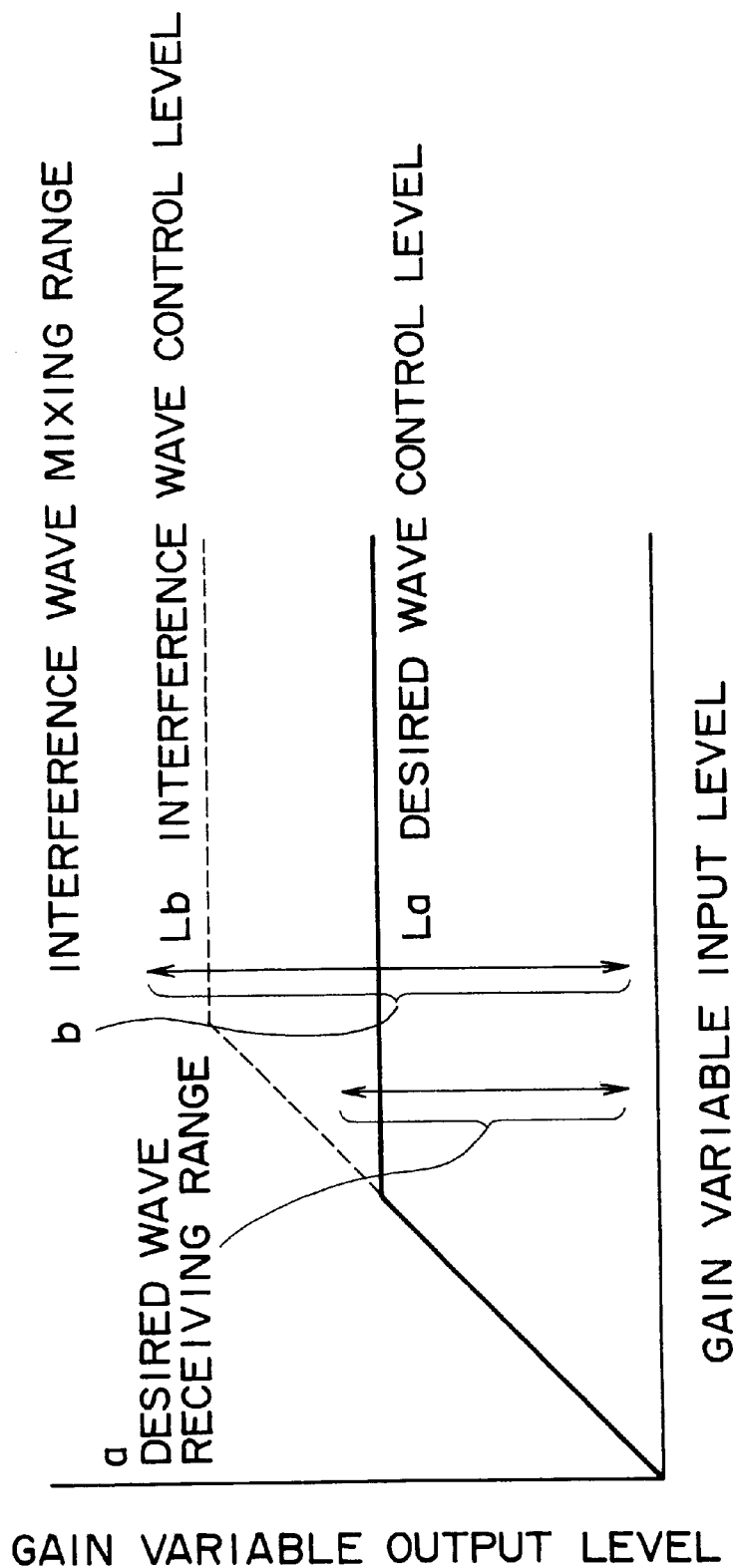
FIG. 2 is a diagram for explaining the signal level input to the active filter circuit.

Moreover, as shown in FIG. 2, the control range b of the frequency band of the interference wave and the control level range a of the desired wave can be uniquely determined by adjusting input/output characteristics of the clip circuit 19 which can control the coefficient values of the coefficient circuits 14a, 14b before the level detection and the gain of the control loop as a whole.

Figure 3:
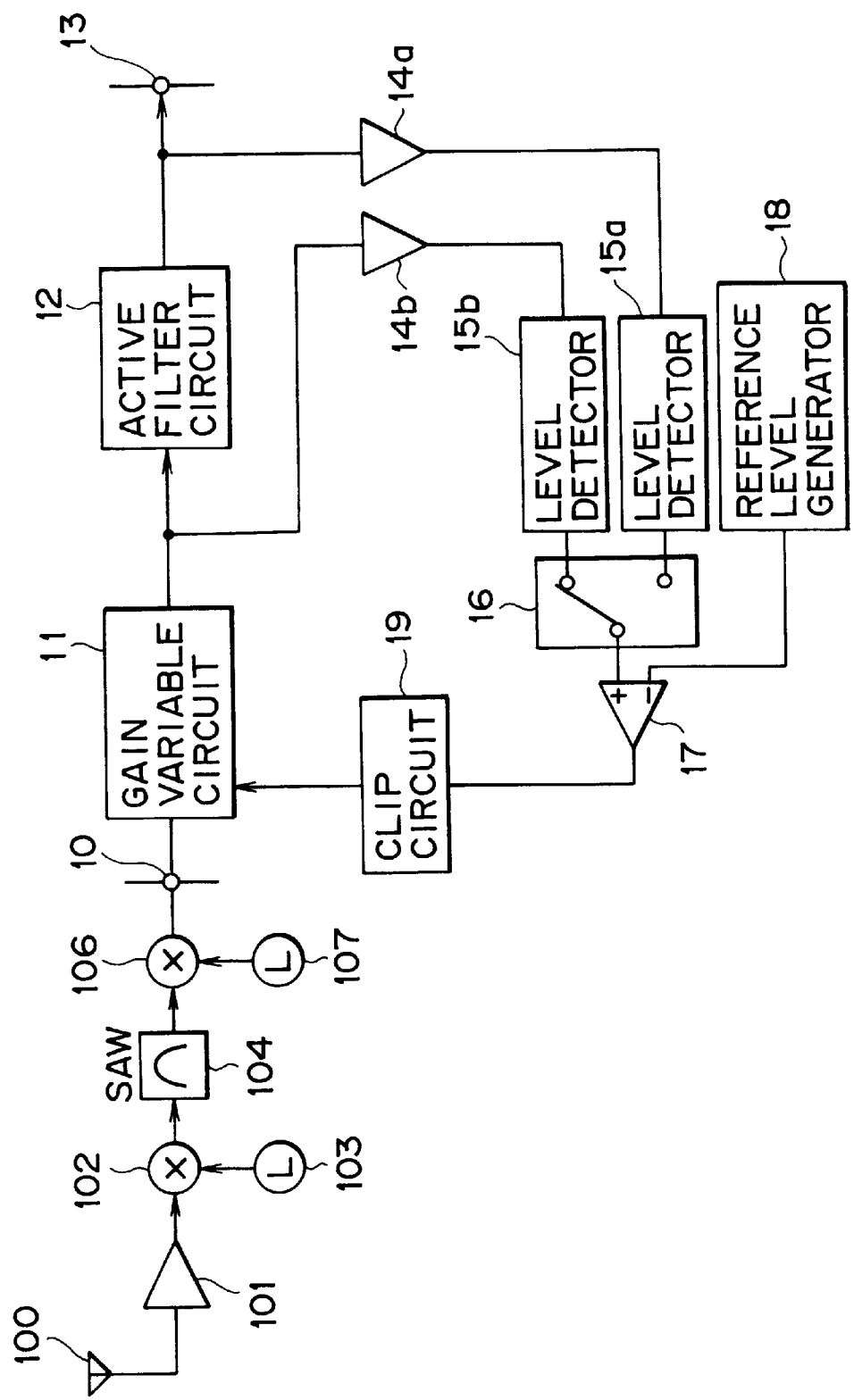
FIG. 3 is a block diagram showing an example of the filter circuit of the present invention.
Figure 5:
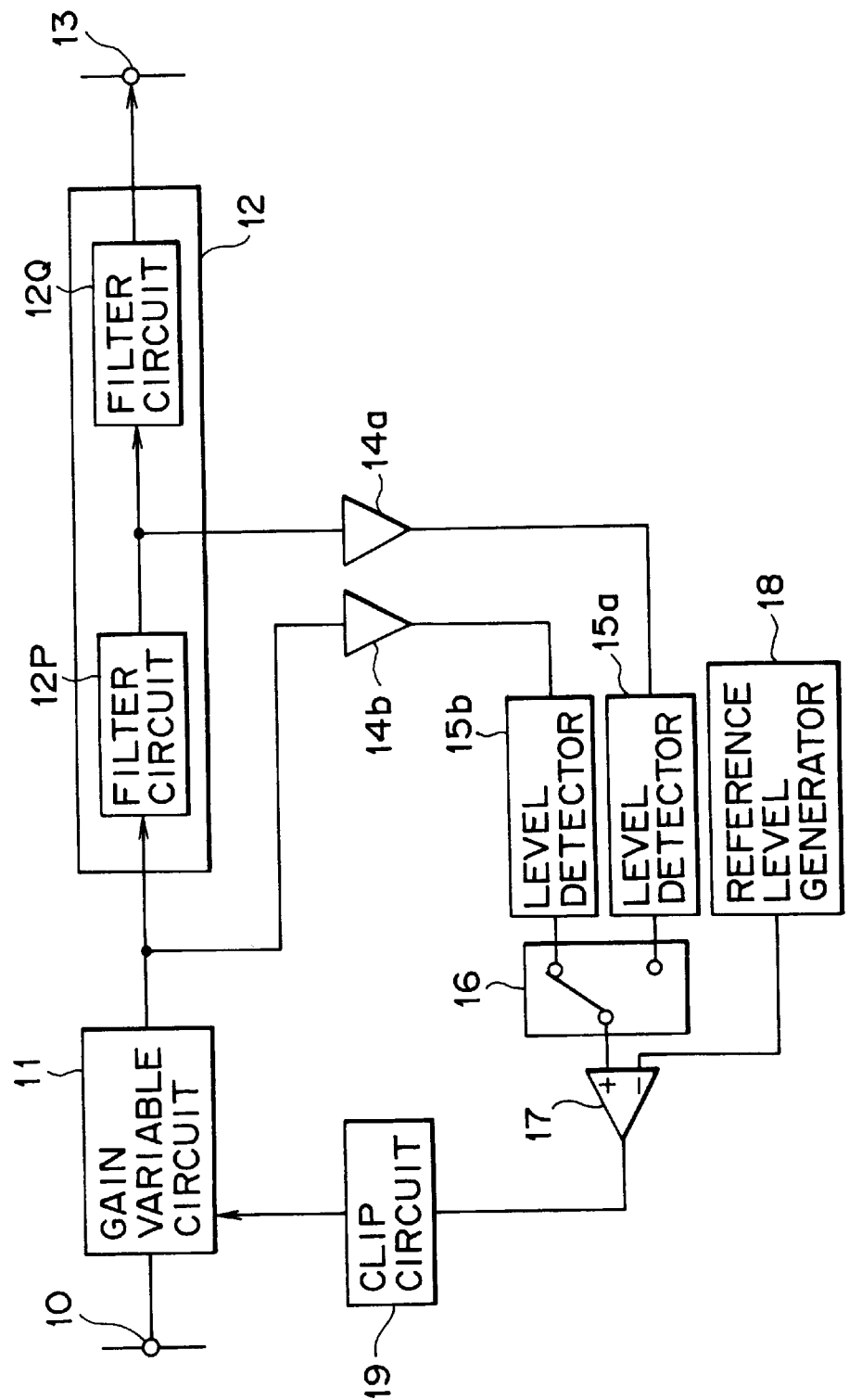
FIG. 5 is a block diagram of a filter circuit of another embodiment of the present invention.

FIG. 5 shows another embodiment of the present invention and the elements like those in FIG. 3 are designated by the like reference numerals.

In this embodiment, the active filter circuit 12 is designed as a multi-stage filter circuit by controllably-connecting two or more filter circuits 12P, 12Q.

The first level detecting circuit 15a for adjusting the gain of the desired wave detects an output of one filter of the multi-stage connected intermediate filter circuit, for example, 12P.

The circuit of this embodiment includes the active filter circuit 12 which is formed of the multi-stage circuit and is formed of the filter providing a complicated feedback loop and many stages of filter. Accordingly, the feedback control resulting in less amount of delay can be structured and assures improvement of stability by obtaining the feedback signal from the filter circuit of the preceding stage having a comparatively linear input/output characteristic and a wide dynamic range to conduct the gain control for the desired wave.

Figure 6:
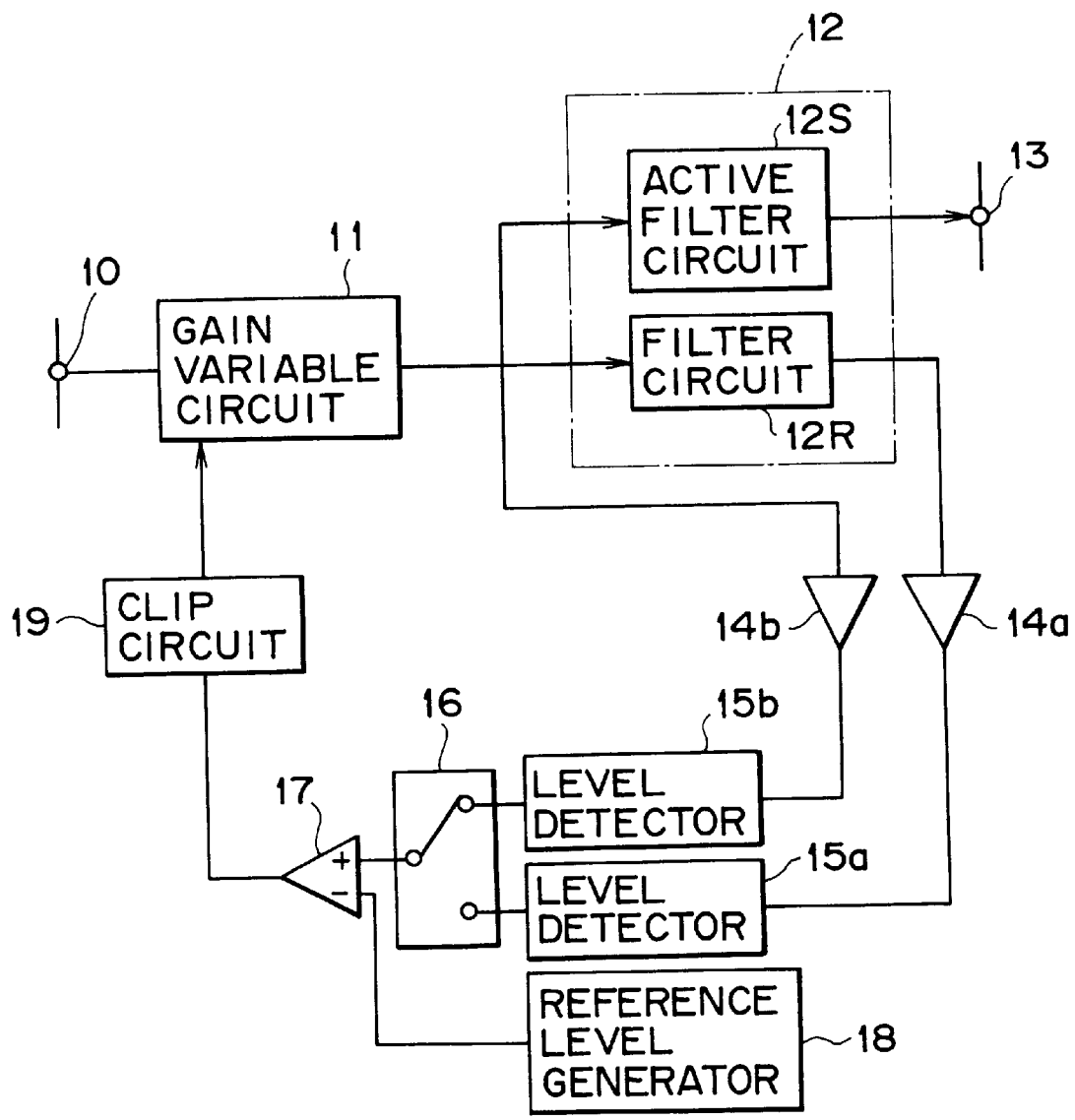
FIG. 6 is a block diagram of a filter circuit of another embodiment of the present invention.

FIG. 6 shows another embodiment of the present invention which conducts the gain control in the same manner as FIG. 3, except for the structure that the active filter circuit 12 is formed by connecting in parallel two filter circuits having almost the same characteristic.

In this case, the active filter circuit 12S is formed of a filter having the desired frequency characteristic, while the filter circuit 12R is formed of a dummy circuit similar to the filter circuit 12S.

The dummy circuit is formed of a circuit which is similar in characteristic to the filter characteristic for selecting the desired signal wave and can easily be designed and the feedback circuit is designed to operate in a stable condition considering phase margin and gain margin, etc.

In this case, since the actual signal path is different from the control signal path, the second filter circuit 12R can be used by adjusting level to the signal level having sufficient S/N.

Figure 7:
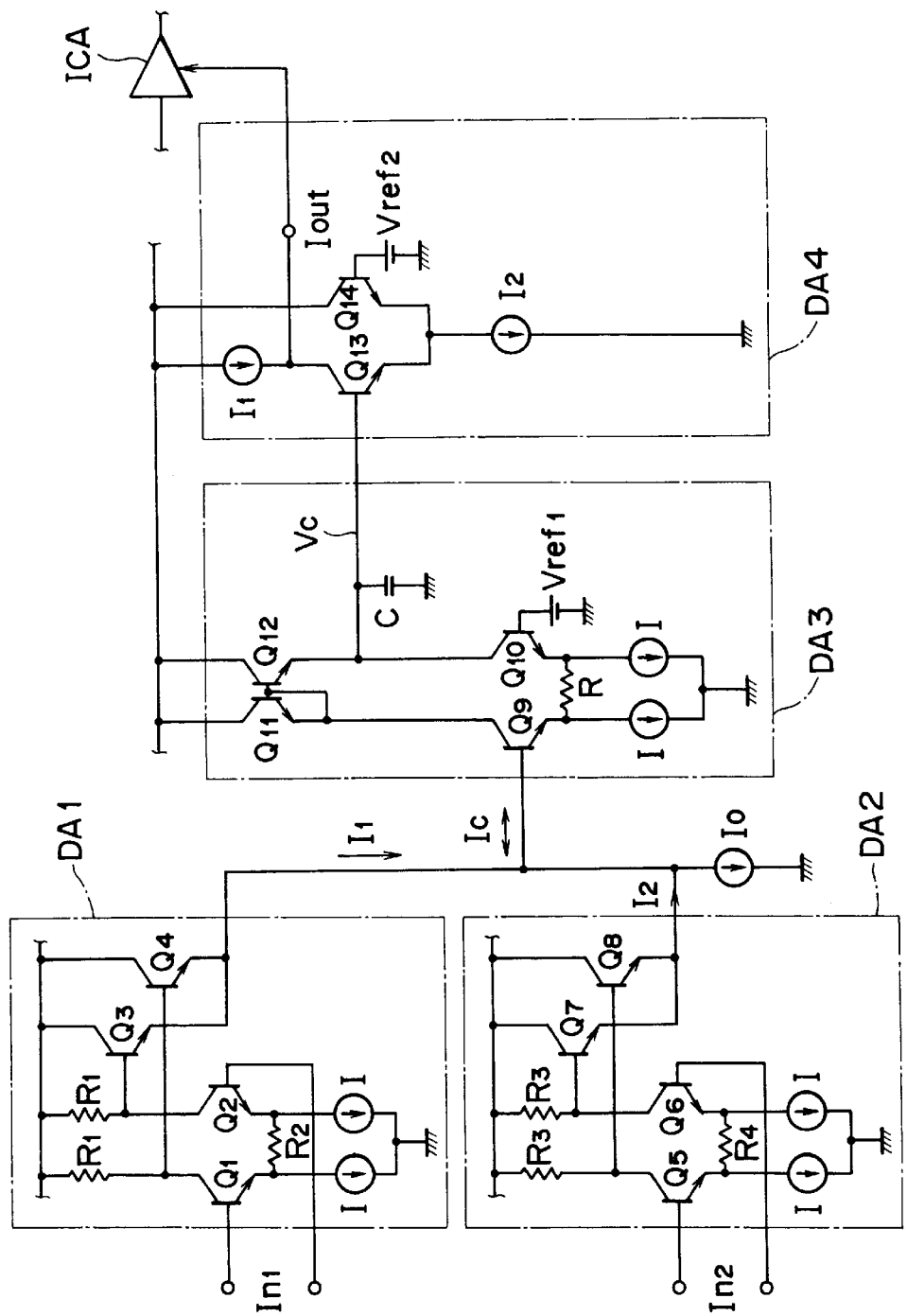
FIG. 7 is a circuit example for realizing a gain control system with an analog circuit.

FIG. 7 shows a circuit example in the case of forming the control circuit to conduct the gain control of the active filter circuit with an analog circuit.

In this FIG., the first level detecting section DA1 is formed of a first coefficient device for detecting an output signal In1 of the active filter, transistors Q1, Q2 and output transistors Q3, Q4 in which the first level detector forms a differential circuit.

Moreover, the second level detecting section DA2 is formed of a second coefficient device for detecting an input signal In2 of the active filter circuit, transistors Q5, Q6 and output transistors Q7, Q8 in which the second level detector forms a differential circuit. The differential input is applied to these circuits but unbalanced input can also be applied.

A ratio R1/R2 of the resistors R1 and R2 and a ratio R3/R4 of resistors R3 and R4 respectively set the first and second coefficient values and these resistance values can determine the control level of the interference wave and that of the desired wave.

The signal of the desired level multiplied by a coefficient by the output transistors Q3, Q4 and Q7, Q8 is detected as the positive polarity signal and the currents I1 and I2 output from the output transistors of these level detecting sections DA1, DA2 are connected in common and are then absorbed by a constant current source I0.

A part of the higher level signal current supplied from the output transistors Q3, Q4 and Q7, Q8 is supplied to the differential type transistor Q9 forming the next integral circuit section DA3, and it is then compared with the reference voltage Vref1 supplied to the other transistor Q19. Thereby, a difference of these voltages charges a capacitor C.

The capacitor C receives a current from the transistors Q11, Q12 forming a current Miller circuit when a signal higher than the predetermined reference voltage Vref1 is input and raises its potential.

The DC element signal charged in the capacitor C is further compared with the reference voltage Vref2 in the differential transistors Q13, Q14 forming a current voltage converting section DA4 and the current corresponding to the difference signal element controls the gain of the gain variable circuit 11 so that the input signal level is set to the predetermined level.

Here, when the current sources I1, I2 provided in the current voltage converting section DA4 are set to the identical values, the control is performed so that an output current becomes equal to a constant value I1 if the input signal voltage Vc of capacitor C is lower than the reference voltage Vref2 and a current of I1–I2 is output if the input signal voltage Vc of capacitor C becomes high. Namely, the adjustment is conducted in matching with the control characteristic of the gain variable circuit 11 of which the gain is controlled by a current.

The circuit corresponding to the switch circuit is formed by connecting in common the emitter to the constant current source I0 and a larger one of the full-wave rectifying output of transistors Q3, Q4 and the full-wave rectifying output of transistors Q7, Q8 gives an inverse bias to the other detecting circuit and the larger rectifying output is preferentially input to the next integral circuit section DA3.

As explained above, since the filter circuit of the present invention provides a gain variable circuit in the former stage and the gain of this gain variable circuit is controlled by the input side signal level and output side signal level of the active filter circuit, there is provided the effect that even if there is a large difference between the frequency band passing the active filter and the signal element of the rejected frequency band, the desired control level can be given to each frequency band and even if the active filter circuit has the non-linear characteristic, the desired frequency can be extracted stably.

Moreover, even when the active filter circuit has the characteristic which does not increase monotonously owing to the complicated feedback circuit, the function to select the frequency depending on the filter characteristic can be maintained and particularly the practical effect can be attained at the time of using the active filter circuit of the present invention to a mobile radio system which is required to realize reduction in size and weight.

What is claimed is:

1. A filter circuit, comprising:

filter means for allowing a signal of a first frequency band to pass and for rejecting a signal of a second frequency band;

gain varying means for controlling a gain of an input signal including the signals of at least said first and second frequency bands and for supplying a level-controlled output signal to said filter means;

first level detecting means for detecting a level of an output signal of said filter means;

second level detecting means for detecting a level of the level-controlled output signal fed to said filter means from said gain varying means; and switching means receiving a detected signal of said first level detecting means and a detected signal of said second level detecting means for outputting a detecting signal of a higher level among the detected signals of said first and second level detecting means, whereby a gain of said gain varying means is controlled by the detecting signal output from said switching means.

2. The filter circuit as set forth in claim 1, further comprising first and second coefficient circuits, whereby the detected signals of said first level detecting means is adjusted in level before being fed to said switching means and the detected signal of said second level detecting means is adjusted in level before being fed to said switching means, respectively.

3. The filter circuit as set forth in claim 1, wherein said filter means is formed of controllably-connected first and second filter circuits and an output level of said first filter circuit is detected by said first level detecting means.

4. The filter circuit as set forth in claim 1, wherein said filter means is formed of a parallel-connected first filter circuit and second filter circuit, wherein the second filter circuit has a filter characteristic similar to a filter characteristic of said first filter circuit and an output signal of said second filter circuit is detected by said first level detecting means.

5. The filter circuit as set forth in claim 1, wherein said switching means is formed of a differential amplifier.

6. The filter circuit as set forth in claim 1, wherein the gain of said gain varying means is controlled by the detecting signal from said switching means generated as an output current of said switching means.

* * * * *